(12) United States Patent
Verma et al.

(10) Patent No.: US 7,489,173 B1
(45) Date of Patent: Feb. 10, 2009

(54) SIGNAL ADJUSTMENT FOR DUTY CYCLE CONTROL

(75) Inventors: Himanshu J. Verma, Mountain View, CA (US); Kwansuhk Oh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 800 days.

(21) Appl. No.: 11/061,697

(22) Filed: Feb. 18, 2005

(51) Int. Cl.
*H03K 3/017* (2006.01)
*H03K 9/08* (2006.01)
*G01R 29/02* (2006.01)

(52) U.S. Cl. .................... 327/175; 327/35; 327/38; 327/176

(58) Field of Classification Search .............. 327/33–38, 327/172–176; 377/55
See application file for complete search history.

(56) References Cited

U.S. PATENT DOCUMENTS

| | | | |
|---|---|---|---|
| 4,239,992 A | 12/1980 | Perkins | |
| 4,338,569 A | 7/1982 | Petrich | |
| 5,097,208 A * | 3/1992 | Chiang | 324/537 |
| 5,256,916 A | 10/1993 | Thurston | |
| 5,367,200 A | 11/1994 | Leonida | |
| 5,455,530 A | 10/1995 | Huppenthal et al. | |
| 5,714,896 A * | 2/1998 | Nakagawa et al. | 327/115 |
| 5,790,479 A | 8/1998 | Conn | |
| 5,877,632 A | 3/1999 | Goetting et al. | |
| 5,914,616 A | 6/1999 | Young et al. | |
| 5,923,621 A | 7/1999 | Kanekal et al. | |
| 6,005,829 A | 12/1999 | Conn | |
| 6,069,849 A | 5/2000 | Kingsley et al. | |
| 6,144,262 A | 11/2000 | Kingsley | |
| 6,212,126 B1 | 4/2001 | Sakamoto | |
| 6,219,305 B1 | 4/2001 | Patrie et al. | |
| 6,232,845 B1 | 5/2001 | Kingsley et al. | |
| 6,233,205 B1 | 5/2001 | Wells et al. | |
| 6,263,034 B1 | 7/2001 | Kanack et al. | |
| 6,324,485 B1 | 11/2001 | Ellis | |
| 6,356,514 B1 | 3/2002 | Wells et al. | |
| 6,404,840 B1 * | 6/2002 | Sindalovsky | 377/48 |
| 6,424,190 B1 | 7/2002 | Kim | |
| 6,445,245 B1 | 9/2002 | Schultz et al. | |
| 6,452,489 B1 | 9/2002 | Ehrlich | |
| 6,501,313 B2 | 12/2002 | Boerstler et al. | |
| 6,509,771 B1 | 1/2003 | Atallah et al. | |

(Continued)

OTHER PUBLICATIONS

U.S. Appl. No. 10/683,944, Young, filed Oct. 10, 2003.

(Continued)

*Primary Examiner*—Quan Tra
*Assistant Examiner*—Colleen O'Toole
(74) *Attorney, Agent, or Firm*—W. Eric Webostad

(57) ABSTRACT

Signal phase adjustment for duty cycle control is described. A first sample clock signal and a second sample clock signal are provided. A first phase signal and a second phase signal are generated responsive to the first sample clock signal, where the first phase signal is out of phase with respect to the second phase signal. The second sample clock signal configured to be swept in phase in relation to the first phase signal. A combined signal is generated where the combined signal has a duty cycle associated with the first phase signal and the second phase signal in combination. A first counter and a second counter are clocked responsive to the second sample clock signal to count. A first count from the first counter is divided by a second count from the second counter to obtain the duty cycle associated with the combined signal.

20 Claims, 4 Drawing Sheets

U.S. PATENT DOCUMENTS

| | | | |
|---|---|---|---|
| 6,549,571 | B1 | 4/2003 | Baba |
| 6,642,760 | B1 * | 11/2003 | Alon et al. .................. 327/158 |
| 6,687,865 | B1 | 2/2004 | Dervisoglu et al. |
| 6,777,980 | B2 | 8/2004 | Young et al. |
| 7,062,692 | B1 | 6/2006 | Lesea |

OTHER PUBLICATIONS

*Xilinx, Inc.*, "The Programmable Logic Data Book," 2000, pp. 3-75 to 3-96, available from Xilinx, Inc., 2100 Logic Drive, San Jose, CA. 95124.

Xilinx, Inc., "Virtex-II Pro Platform FPGA Handbook", Dec. 2000, pp. 33-75, DS031, v 1.1, available from Xilinx, Inc., 2100 Logic Drive, San Jose, CA. 95124.

Xilinx, Inc., "Virtex-II Pro Platform FPGA Handbook", Oct. 2002, DS083-1, pp. 19-71, available from Xilinx, Inc., 2100 Logic Drive, San Jose, CA. 95124.

U.S. Appl. No. 10/402,837, filed Mar. 27, 2003, Lesea, A. et al., Xilinx, Inc. 2100 Logic Drive, San Jose, CA 95124.

* cited by examiner

SIGNAL ADJUSTMENT FOR DUTY CYCLE CONTROL

FIELD OF THE INVENTION

One or more aspects of the invention relate generally to adjustment for duty cycle control and, more particularly, to dynamically adjust frequency or phase for duty cycle control.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines".

Another such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, testing of a design instantiated in programmably configurable circuitry of an FPGA ("FPGA fabric") or of circuitry embedded in an FPGA may be difficult owing to inaccuracies in duty cycle of a test clock signal. Moreover, circuit operation may be limited owing to a lack of control of duty cycle of an oscillation signal, including clock signaling.

Accordingly, it would be desirable and useful to provide means for phase adjustment for duty cycle control.

SUMMARY OF THE INVENTION

One or more aspects of the invention generally relate to adjustment for duty cycle control and, more particularly, to dynamic phase or frequency adjustment for duty cycle control.

An aspect of the invention is a method for providing a duty cycle adjusted signal, including: providing a first sample clock signal; providing a second sample clock signal; generating a first phase signal and a second phase signal responsive to the first sample clock signal, where the first phase signal is out of phase with respect to the second phase signal; sweeping phase of the second sample clock signal with respect to phase of the first phase signal; generating a combined signal, where the combined signal has a duty cycle associated with the first phase signal and the second phase signal in combination; clocking a first counter to provide a first count, the first counter clocked with the second sample clock signal; clocking a second counter to provide a second count, the second counter clocked with the second sample clock; periodically activating and deactivating the first counter responsive to the combined signal to affect the first count; maintaining the second counter in an active state for counting; and dividing the first count from the first counter with the second count from the second counter to obtain the duty cycle associated with the combined signal.

Another aspect of the invention is an integrated circuit for providing an output signal with a target duty cycle, including: a first clock source configured to provide a first sample clock signal; a second clock source configured to provide a second sample clock signal; a multi-tap settable delay coupled to receive the first sample clock signal and configured to provide a first phase signal and a second phase signal responsive to the first sample clock signal, where the first phase signal is out of phase with respect to the second phase signal; the first clock source and the second clock source configured such that the second sample clock signal is swept in phase with respect to the first phase signal; a double-data rate flip-flop coupled to be clocked responsive to the first phase signal and the second phase signal and configured to provide a combined signal having rising edges responsive to the first phase signal and having falling edges responsive to the second phase signal, where the combined signal has a duty cycle associated with the rising edges and the falling edges; a first counter and a second counter, where the first counter is coupled to count responsive to the second sample clock signal and the combined signal to provide a first count and where the second counter is coupled to count responsive to the second sample clock signal to provide a second count; a divider coupled to receive the first count and the second count and configured to divide the first count by the second count to provide a resultant signal, where the resultant signal is associated with the duty cycle; and control logic coupled to receive the resultant signal and configured to provide control signaling to the multi-tap settable delay to adjust phase of the second phase signal to provide the output signal with the target duty cycle.

Yet another aspect of the invention is a system for testing duty cycle, including: an integrated circuit coupled to a tester. The integrated circuit includes: a first clock source configured to provide a first sample clock signal; a second clock source configured to provide a second sample clock signal; a multi-tap settable delay coupled to receive the first sample clock signal and configured to provide a first phase signal and a second phase signal responsive to the first sample clock signal, where the first phase signal is out of phase with respect to the second phase signal; the first clock source and the second clock source configured such that the second sample clock signal is swept in phase with respect to the first phase signal; a double-data rate flip-flop clocked responsive to the first phase signal and the second phase signal and configured to provide a combined signal having rising edges responsive to the first phase signal and having falling edges responsive to the second phase signal, where the combined signal has a duty cycle associated with the rising edges and the falling edges; a first counter and a second counter, where the first counter is coupled to count responsive to the second sample clock signal and the combined signal to provide a first count and where the second counter is coupled to count responsive to the second sample clock signal to provide a second count; and a divider coupled to receive the first count and the second count and configured to divide the first count by the second count to provide a resultant signal, where the resultant signal is associated with the duty cycle. The integrated circuit coupled to control logic of the tester to receive the resultant signal thereto.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
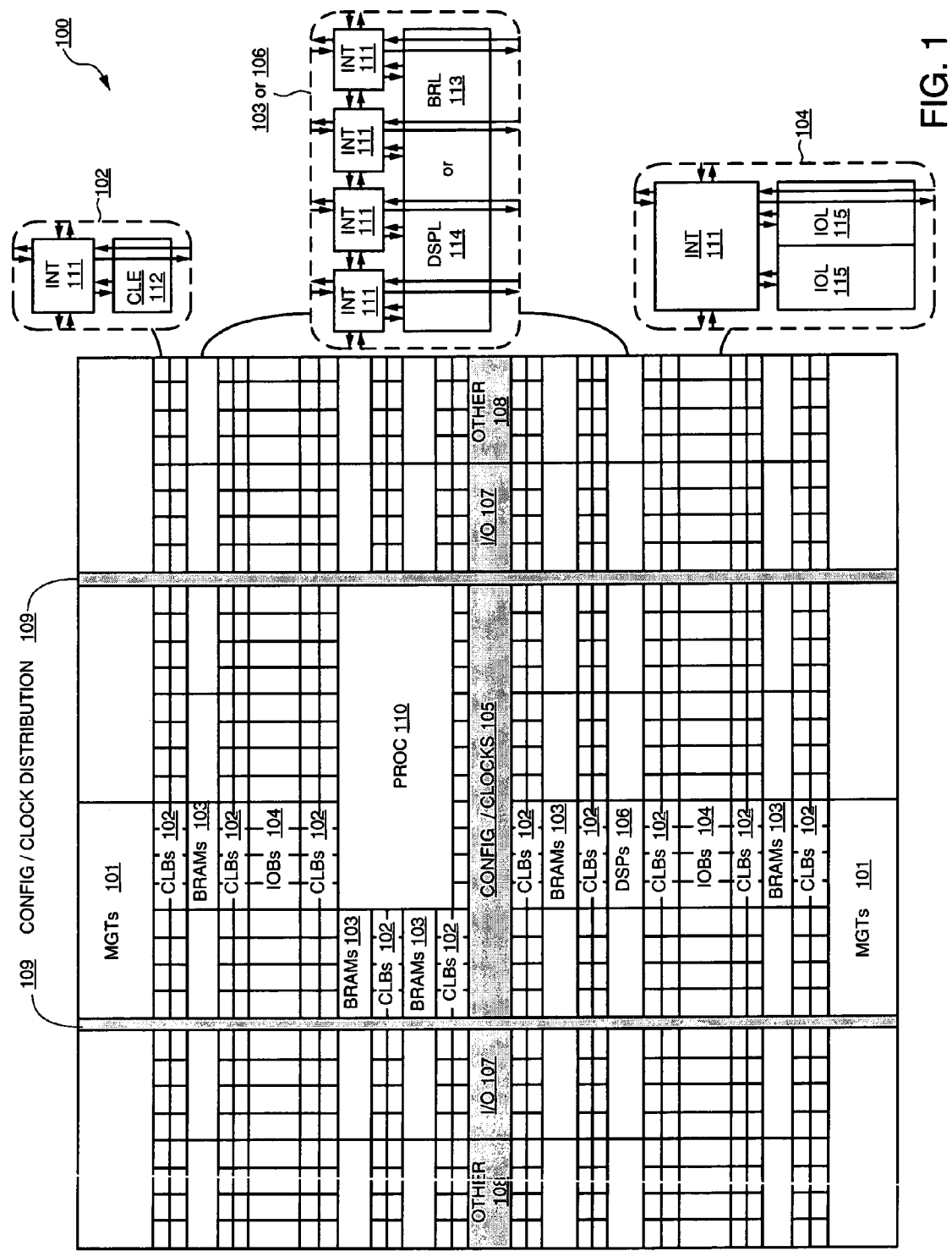
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944 entitled, "Columnar Architecture" by Steve P. Young, filed Oct. 10, 2003, which is incorporated by reference herein in its entirety. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2A:
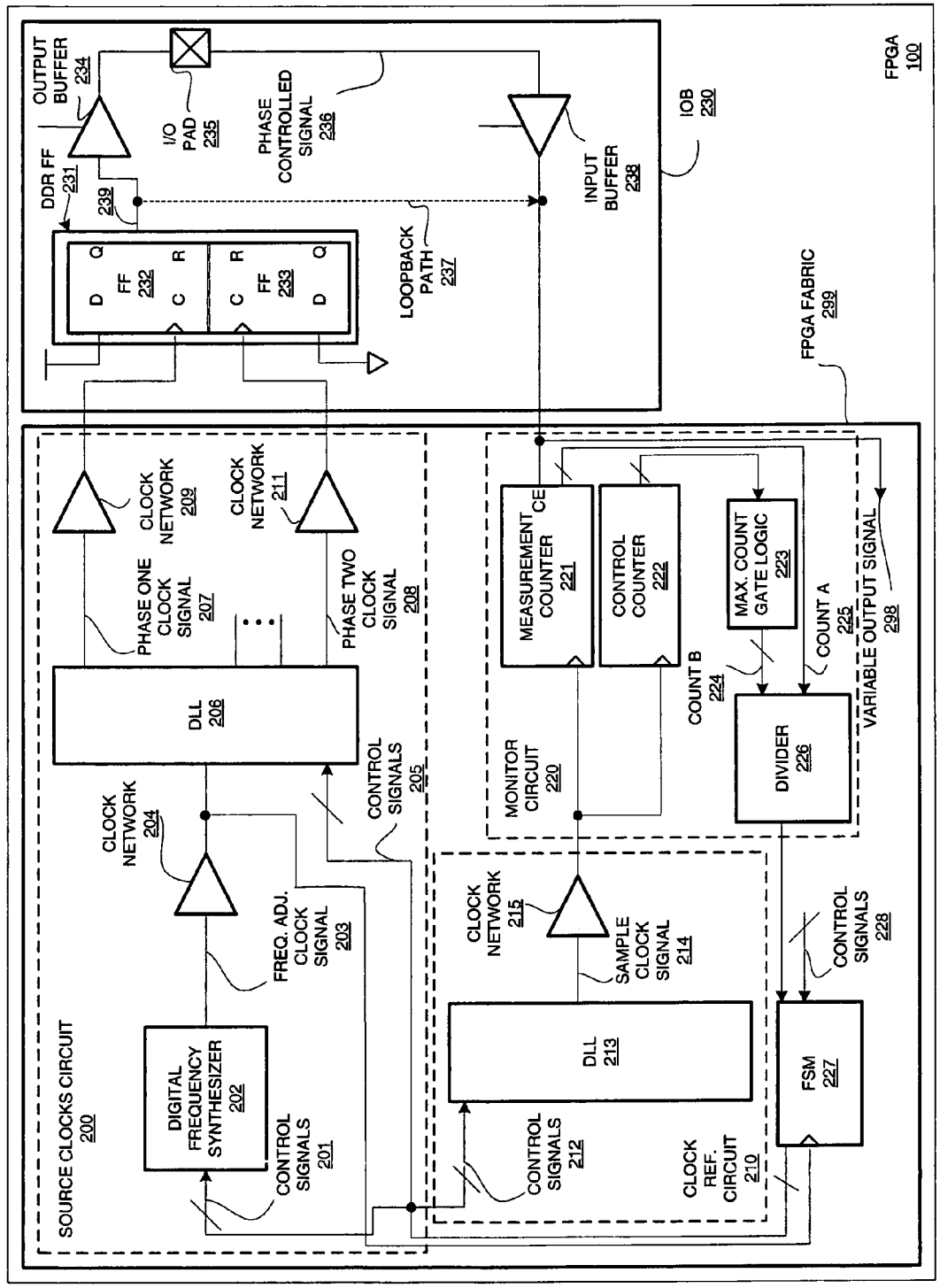
FIG. 2A is a block/schematic diagram depicting an exemplary embodiment of an FPGA having self-test circuitry configured for asynchronous operation.

FIG. 2A is a block/schematic diagram depicting an exemplary embodiment of FPGA 100 having self-test circuitry. This self-test circuitry may be programmably configured in FPGA fabric 299 to provided configured-in self test circuitry. Configured-in self-test circuitry of FPGA 100 includes source clocks circuit 200, clock reference circuit 210, monitor circuit 220, input/output interface circuit 230, and finite state machine (FSM) 227. For an FPGA implementation, input/output interface circuit 230 is implemented with an IOB of FPGA 100 configured for loopback.

Control signals 228 are provided to FSM 227. Control signals 228 may be provided as part of an initialization of FPGA 100, or may be provided from a tester coupled externally to FPGA 100 for testing thereof. FSM 227 may have registers for registering a target duty cycle obtained from control signaling of control signals 228. Control signals 201, 205, and 212 may be provided from FSM 227. Alternatively, control signals 201, 205, and 212 may be provided from a tester coupled externally to FPGA 100 for testing thereof. Control signals 228 may be to set FSM 227 to provide a particular duty cycle as described below in additional detail, and control signals 201, 205, and 212 may be provided to set frequency and initial delay settings of programmable delay lines.

Control signals 201 are provided to a clock source, such as digital frequency synthesizer 202. Control signals 201 are to adjust frequency and other signal settings of digital frequency synthesizer (DFS) 202. As digital frequency synthesizer 202 is well known, it is not described in detail herein.

Output of digital frequency synthesizer signal 202 is frequency adjusted clock signal 203. Frequency adjusted clock signal 203 is set to a target frequency, though the fixed frequency setting may be varied depending on what target frequency is being used. Thus, frequency adjusted clock signal 203 may be thought of as a sample clock signal; however, as sample clock signal 214 is described below, reference shall be made to frequency adjusted clock signal 203 for clarity. Frequency adjusted clock signal 203 is provided to clock FSM 227 and is provided to clock network 204, illustratively shown as a buffer. For an FPGA 100 implementation, clock network 204 maybe a global buffer multiplexer configured clock tree. Output of clock network 204 is provided to delay-locked loop ("DLL") 206. A control signal of control signals 205 is provided to DLL 206 to put DLL 206 in a test mode. Thus, for example, a control mode signal of control signals 205 would indicate a test mode. More particularly, DLL 206 may be set to be in an open loop test mode to provide a voltage and temperature compensated delay line. Examples of The DFS 202 and DLL 206 (and DLL 213) can be found in the Virtex V4 FPGA product from Xilinx, Inc. of San Jose, Calif. and described in the Virtex V4 FPGA Handbook, August 2004, from Xilinx, Inc.

DLL 206 includes at least two possible clock outputs, though more than two possible clock outputs may be available. DLL 206 may have clock outputs at graduated phases, such as a phase of 0 degrees, 90 degrees, 180 degrees, and 270 degrees, for example. In this example, phase one clock signal 207 and phase two clock signal 208, each output from DLL 206, have different phases. Phase one clock signal 207 is held at a fixed phase value, and phase two clock signal 208 may be adjusted. For purposes of clarity, it shall be assumed that phase one clock signal 207 is a clock signal of phase 0 and phase two clock signal 208 is a clock signal of phase 180, namely 180 degrees out-of-phase with respect to phase one clock signal 207. Thus, as phase one clock signal 207 is output from a 0 degree phase shift setting, it should be understood that frequency adjusted clock signal 203 is at least substantially unaltered in phase for output from DLL 206. It should be understood that other phase relationships may be used. Moreover, it should be understood that the 180 degrees phase relationship in the example may be adjusted, as described below in additional detail.

Phase one clock signal 207 is input to clock network 209, and phase two clock signal 208 is input to clock network 211. Clock networks 209 and 211 may be set such that their path delays are substantially equal. Again, clock networks 209 and 211 are illustratively shown as buffers. For an FPGA 100 implementation, clock networks 209 and 211 may be implemented in respective global buffer multiplexer configured clock trees. Output of clock network 209 is input to a clock port of a double data rate ("DDR") flip-flop ("FF") 231, and output of clock network 211 is input to another clock port of DDR flip-flop 231. DDR flip-flop 231 may be thought of as having two flip-flops 232 and 233. Thus, more particularly, output of clock network 209 is used to clock a flip-flop 232 having its data input port tied to a logic high level, and output of clock network 211 is used to clock flip-flop 233 having its data input port tied to a logic low level. Thus, flip-flop 232 is clocked responsive to phase one clock signal 207, and flip-flop 233 is clocked responsive to phase two clock signal 208. DDR output 239 in a non-inverting configuration is obtained by tying data port of FF 232 to logic high, and data port of FF 233 to logic low. Alternatively, an inverting configuration may be obtained, where the logic values applied to data ports of FFs 232 and 233 are reversed from the non-inverting configuration, i.e. logic low to the data port of FF 232 and logic high to the data port of FF 233. Thus it should be appreciated that output of DDR flip-flop 231 controls a rising edge of a phase controlled signal 236 responsive to phase one clock signal 207, and a falling edge of phase controlled signal 236 responsive to phase two clock signal 208. In other words, a rising edge of phase one clock signal 207 is used to set a rising edge of phase controlled signal 236, and a rising edge of phase two clock signal 208 is used to set a falling edge of phase controlled signal 236, where both of flip-flops 232 and 233 are rising edge toggled. Notably, it is not necessary that both of flip-flops 232 and 233 be rising edge toggled, as falling edge toggling may be used. Moreover, it should be understood that phase one clock signal 207 may be fixed to a value for providing rising edge control of phase controlled signal 236.

Internal workings of DDR flip-flop 231 are not described in detail, as such DDR flip-flops are well known as may be found in U.S. Pat. No. 6,777,980. However, it should be appreciated that output 239 of DDR flip-flop 231 is effectively a superposed signal responsive to phase one clock signal 207 and phase two clock signal 208.

Output of DDR flip-flop 231 is provided to an output buffer 234. For an IOB 230 implementation, output buffer 234 is a tri-stateable output buffer, which is set to pass output of DDR flip-flop 231 during this testing. For an IOB 230 implementation, output of output buffer 234 is provided to an input/output ("I/O") pad 235 or node associated therewith for input of phase controlled signal 236 to input buffer 238. For an IOB 230 implementation, input buffer 238 is a tri-stateable input buffer, which is set to pass phase controlled signal 236 during this testing. IOB 230 in this configuration is configured for a loop back operation. Alternatively, IOB 230 may be configured to use an optional loop back path 237 to facilitate looping back from/to FPGA fabric 299 without going into a high voltage domain associated with input/output pad 235. Alternatively, input/output pad 235 may be used to externally monitor phase controlled signal 236 such as by coupling an integrated circuit ("IC") tester or automated test equipment ("ATE") to such pad.

Assuming loop back path 237 is not used, output from input buffer 238 is provided to a counter activation ("counter enable") port of measurement counter 221. Monitor circuit 220 includes measurement counter 221, control counter 222, maximum count gate logic 223, and divider 226.

Clock reference circuit 210 is coupled to monitor circuit 220. Control signals 212 are provided to DLL 213, such as to set/adjust frequency and phase of sample clock signal 214. Though a DLL 213 is shown, another type of clock source, such as a digital frequency synthesizer, ring oscillator, or other clock source may be used. Output of DLL 213 is a sample clock signal 214. Sample clock signal 214 frequency may be varied such that it operates asynchronously with respect to frequency adjusted clock signal 203. Thus, clock sources 202 and 213 may operate asynchronously with respect to one another such that phase of sample clock signal 214 source sweeps through phase of phase one clock signal 207. For example, sample clock signal 214 may be swept though an entire clock period of phase one clock signal 207 to check for samples of logic highs, logic lows, or both, depending on configuration, to determine a duty cycle. If the sampling signal is asynchronous to the signal under test, then there may be no reasonable way to tell when the sampling edge might sample the signal under consideration, so, this can be thought of as a form of random sampling. If the sampling is permitted to continue for a relatively long time, namely, to when the run time of the test can be traded-off with the sampling frequency, then the sampling edge could have sampled a large portion of the signal under test. Accordingly, by comparing how many times the sampling edge was used to sample logic highs/lows, the duty cycle can be determined. This sampling may be done over a sufficiently long duration of time to provide a statistically significant sample size to enhance measurement accuracy.

Sample clock signal 214 is provided to clock network 215 of clock reference circuit 210. Clock network 215 is illustratively shown here as a buffer. For an FPGA 100 implementation, clock network 215 may be implemented as a global buffer multiplexer configured clock tree.

Output of clock network 215 is provided to clock ports of measurement counter 221 and control counter 222. Control counter 222 is configured to count, for example, rising edges of sample clock signal 214. In contrast, measurement counter 221 is only activated for counting rising edges of sample clock signal 214 during time when phase controlled signal 236 is active, namely at a logic high level. Alternatively, an active low implementation may be used. As a further alternative, a falling edge triggering implementation may be used. Accordingly, counters 221 and 222 can produce different count results, as control counter 222 is enabled for counting while measurement counter 221 is selectively enabled and disable for counting responsive to duty cycle of phase controlled signal 236.

Output of measurement counter 221 is provided as count A signal 225 to divider 226. Output of control counter 222 is provided to maximum count gate logic 223. Maximum count gate logic 223 outputs count B signal 224 to divider 226. Count B signal 224 has a bit width corresponding to the bit width output from control counter 222. Count A signal 225 has a bit width corresponding to the count size of counter 221. For purposes of clarity and not limitation, it shall be assumed that this bit width is 16 bits, though other bit widths may be used. Maximum count gate logic 223 only asserts count B signal 224 to divider 226 responsive to control counter 222 having counted to a maximum or terminal count value of control counter 222. Notably, a maximum count value need not be used, as such threshold may be less than the maximum; however, for purposes of clarity by way of example and not limitation, it shall be assumed that a maximum count value is used.

Thus, in the example of a 16-bit counter for control counter 222, once control counter 222 counts to $2^{16}$, which is equal to 64K, and provides such count to maximum count gate logic 223, count B signal 224 will be provided to divider 226. Divider 226 is configured to divide the value of count A signal 225 by the value of count B signal 224. It should be understood that at a point in time the relationship of these two counts is essentially the duty cycle of phase controlled signal 236. Thus, output of divider 226 provided to FSM 227 indicates, at least approximately, the then current duty cycle of phase controlled signal 236.

Phase controlled signal 236 may be dynamically adjusted responsive to output of divider 226. In other words, output of divider 226 provided to FSM 227 may be used to dynamically adjust phase of phase two clock signal 208 via control signals 205 provided from FSM 227 to DLL 206. Thus, for example, if the measured duty cycle based on divider 226 output was not 50/50 meaning that phase two clock signal 208 was not 180 degrees out of phase with respect to phase one clock signal 207, FSM 227, configured to provide a 50/50 duty cycle, may provide a control oscillator signal to DLL 206 to incrementally increment or decrement delay for adjustment toward obtaining a 50/50 duty cycle. The foregoing description is merely an example, as FSM 227 may be configured to provide a duty cycle other than a 50/50 duty cycle. Moreover, for an embodiment of DLL 206, it should be appreciated that phase two clock signal 208 may be adjusted over a wide range in relation to phase one clock signal 207. Again, it should be understood that phase two clock signal 208 need not be 180 degrees out of phase with respect to phase one clock signal 207, as another phase relationship may be used.

Thus, it should be understood that FSM 227 may be used to provide a closed feedback loop system to dynamically adjust duty cycle to maintain a target duty cycle. To reduce the effect of a change in pulse width due to propagation, monitor circuit 220 may be placed in close proximity to the structure using an adjusted phase clock signal 236. Moreover, to enhance accuracy, monitor circuit 220 may be operated for multiple cycles of sample clock signal 214 prior to using count results from monitor circuit 220.

It should be understood that phase controlled signal 236 input to a clock enable port of measurement counter 221 has a duty cycle, which may be determined and adjusted. Thus, input to the clock enable port of measurement counter 221 may be tapped to provide a phase adjusted pulse width, namely a variable pulse width output signal 298. Moreover, because a digital frequency synthesizer or other frequency adjustable oscillator may be used as a clock source, such as digital frequency synthesizer 202, where frequency may be varied, it should be appreciated that both frequency and duty cycle of variable output signal 298 are adjustable. Though it was described that DLL 206 is put in an open loop test mode, it should be understood that once a target duty cycle is reached, phase controlled signal 236 may be provided to a circuit in FPGA 100, including a circuit instantiated in FPGA fabric 299 of FPGA 100, or may be provided external to FPGA 100 via input/output pad 235, for either a test mode or a user mode.

Figure 2B:
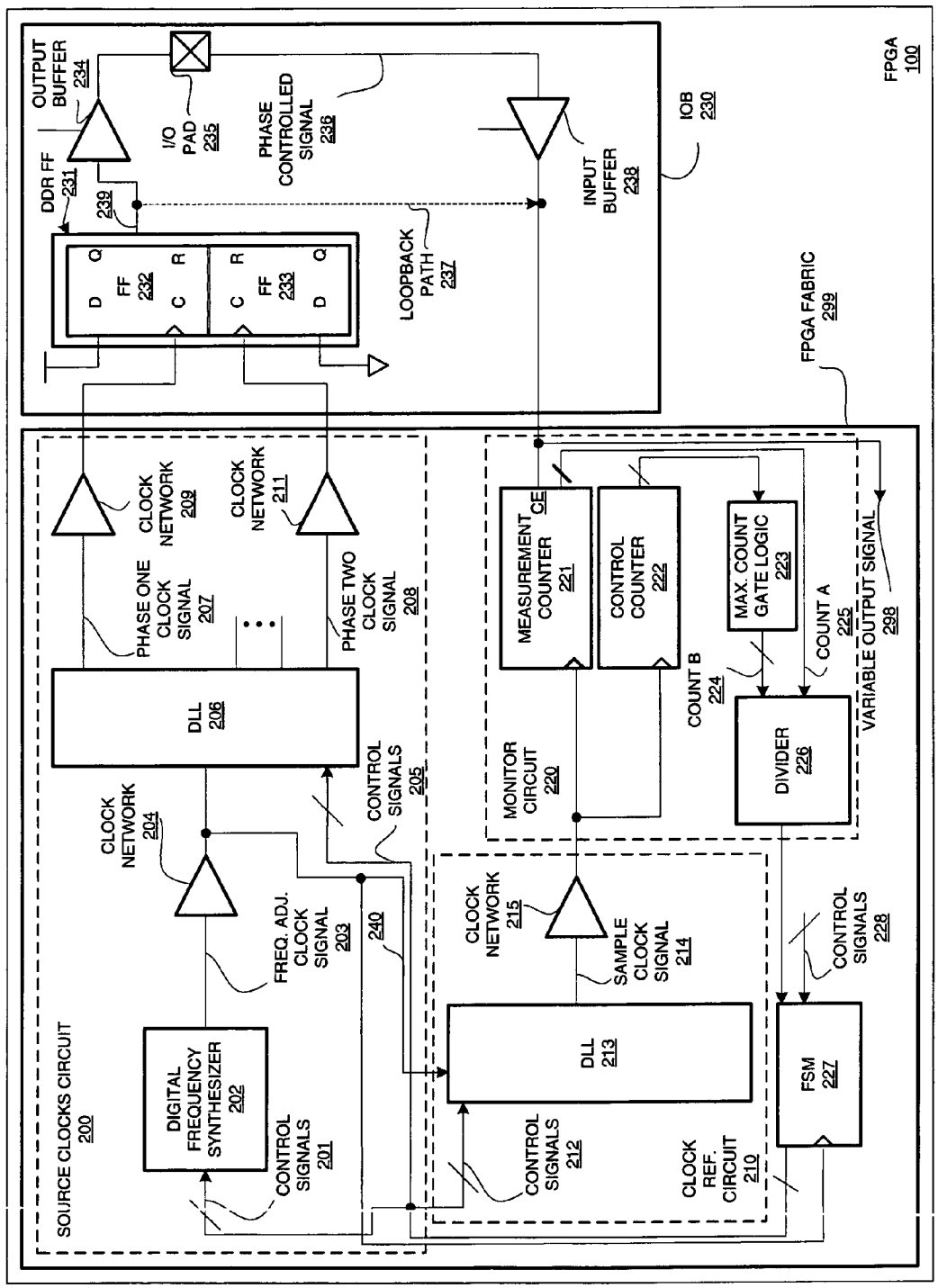
FIG. 2B is a block/schematic diagram depicting an exemplary embodiment of an FPGA having self-test circuitry configured for synchronous operation.

FIG. 2B is a block/schematic diagram depicting an exemplary embodiment of FPGA 100 having self-test circuitry configured for synchronous operation. Where the description is the same as between FIGS. 2A and 2B, it is not repeated here for purposes of clarity. In a synchronous sweeping configuration, both DLL 206 and DLL 213 may be configured to sweep the phase of phase one clock signal 207 and sample clock signal 214 with respect to one another. In this configuration, phase is set such that frequency adjusted clock signal 203 and sample clock signal 214 phases sweep across one another over some period of time. In the synchronous sweeping embodiment, DFS 202 is used to clock DLL 213. In test mode, DFS 202 and DLL 213 are internally configured to operate as ring oscillators, where their respective frequencies may be adjusted by turning on/off taps in a delay line of such ring oscillator configuration.

DLL 213 locks onto clock signal provided from the output of clock network 204, and then DLL 213 can be instructed to phase retard its output in fine steps so as to section-up the entire clock period applied to its input. In this embodiment, this phase retarded signal becomes sampling clock signal 214. In an implementation of this embodiment, measurement counter 221 may include flip-flop clocked responsive to sampling clock signal 214 and having its data port of driven by output 239, either via loopback path 237 or buffer 238. A clock period is divided up by a number of slices, which may vary from application to application. Thus, for a given clock period, the number of times the flip-flop used in measurement counter 221 clocks in a logic-high is divided by the number of slices to which control counter 222 is set, the result of which indicates the duty cycle of output signal 239. Increasing frequency of frequency adjusted clock signal 203 helps improve precision of duty cycle measurement using the synchronous sampling embodiment, where the sampling edge is swept across the entire clock period of the signal under test.

For both FIGS. 2A and 2B, DFS 202 and DLL 213 may operate in a test mode, and thus an external clock need not be provided to FPGA 100 to clock DFS 202 and DLL 213. It is not necessary that DLL 213 and DFS 202 be a DLL and a DFS, respectively, as they may both be DLLs or DFSs, or they may be reverse such that DFS 202 is a DLL and DLL 213 is a DFS. Alternatively, a user mode may be used where an external clock signal is provided to FPGA 100, which may be internally distributed to FPGA 100 to configured-in self-test circuitry as part of control signals 228.

Figure 3:
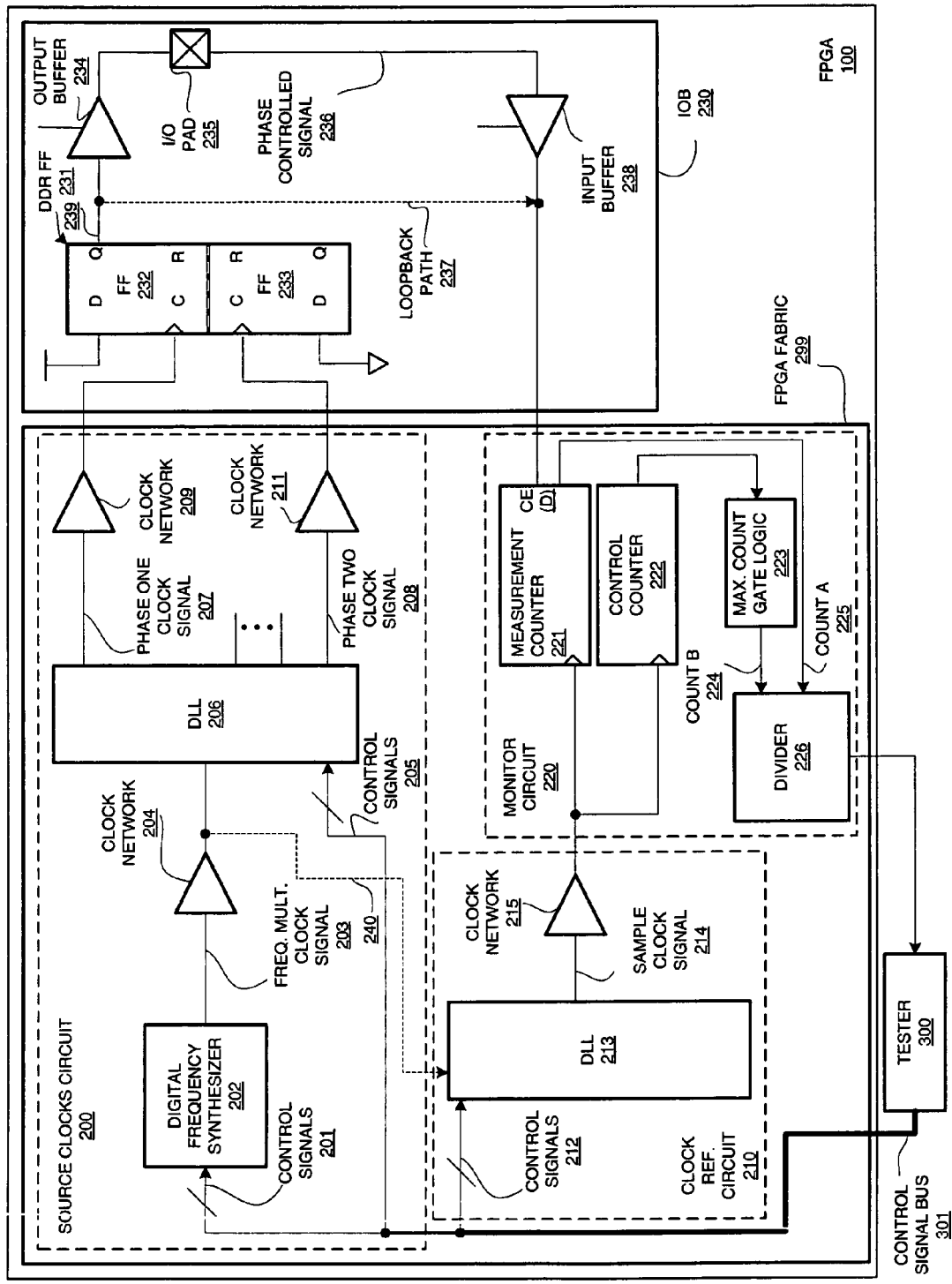
FIG. 3 is a simplified block/schematic diagram depicting an exemplary embodiment of an FPGA coupled to a tester.

FIG. 3 is a simplified block/schematic diagram depicting an exemplary embodiment of FPGA 100 coupled to tester 300. Though FSM 227 of FIGS. 2A and 2B may be instantiated in configurable logic of FPGA fabric 299 to register in values to be used for configuring variable output signal 298 for configured-in self-testing, it should be appreciated that an external tester 300 may be coupled to clock reference circuit 210 and source clocks circuit 200 via control signal bus 301 for providing control signals. More particularly, tester 300 provides control signals 212 to clock reference circuit 210 and provides control signals 201 and 205 to source clocks circuit 200. As operation in circuitry, other than coupling of tester 300, is the same as that described with respect to FPGA 100 of FIGS. 2A and 2B, the description that is the same is not repeated here. Output of divider 226 provides an indication of duty cycle of the signal provided to the clock enable port of measurement counter 221. Output of divider 226 is provided to tester 300. Tester 300 may be used to adjust phase relationship of phase one clock signal 207 to phase two clock signal 208. For example, tester 300 may be used to insure that DLL 206 phase taps correspond to designed values. Notably, a dashed line 240 is indicated for DLL 213 to obtain a clock signal from the output of clock network 204 to indicate that such connectivity need only be present for a synchronous sweeping implementation. Thus, connectivity as indicated by dashed line 240 would not be present for an asynchronous implementation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for providing a duty cycle adjusted signal, comprising:
   providing a first sample clock signal;
   providing a second sample clock signal;
   generating a first phase signal and a second phase signal responsive to the first sample clock signal, the first phase signal being out of phase with respect to the second phase signal;
   generating a combined signal, the combined signal having a duty cycle associated with the first phase signal and the second phase signal in combination;
   clocking a first counter to provide a first count, the first counter clocked with the second sample clock signal;
   clocking a second counter to provide a second count, the second counter clocked with the second sample clock signal;
   periodically activating and deactivating the first counter responsive to the combined signal to affect the first count;
   maintaining the second counter in an active state for counting; and
   dividing the first count from the first counter with the second count from the second counter to obtain the duty cycle associated with the combined signal.

2. The method according to claim 1, further comprising adjusting phase of the second phase signal responsive to the duty cycle to provide the duty cycle adjusted signal.

3. The method according to claim 2, wherein the second count is a maximum count of the second counter; and wherein the dividing is done with a divider; the method further comprising configuring configurable logic to provide the first counter, the second counter, and the divider.

4. The method according to claim 2, wherein the configurable logic is of a programmable logic device.

5. The method according to claim 1, wherein the first sample clock signal is used to provide the second clock signal such that phases of the first sample clock signal and the second sample clock signal are swept across one another over a period of time, the second sample clock signal being synchronously swept in phase with respect to the first phase signal.

6. The method according to claim 1, wherein the first sample clock signal and the second sample clock signal are respectively provided from a first clock source and a second clock source operated asynchronously with respect to one another, the second sample clock signal being swept through an entire clock period of the first phase signal.

7. An integrated circuit for providing an output signal with a target duty cycle, comprising:
   a first clock source configured to provide a first sample clock signal;
   a second clock source configured to provide a second sample clock signal;
   a multi-tap settable delay coupled to receive the first sample clock signal and configured to provide a first phase signal and a second phase signal responsive to the first sample clock signal, the first phase signal being out of phase with respect to the second phase signal;
   the first clock source and the second clock source configured such that the second sample clock signal is swept in phase with respect to the first phase signal;

a double-data rate flip-flop coupled to be clocked responsive to the first phase signal and the second phase signal, the double-data rate flip-flop configured to provide a combined signal, the combined signal having rising edges responsive to the first phase signal and having falling edges responsive to the second phase signal, the combined signal having a duty cycle associated with the rising edges and the falling edges;

a first counter and a second counter, the first counter coupled to count responsive to the second sample clock signal and the combined signal to provide a first count, the second counter coupled to count responsive to the second sample clock signal to provide a second count;

a divider coupled to receive the first count and the second count and configured to divide the first count by the second count to provide a resultant signal, the resultant signal being associated with the duty cycle; and control logic coupled to receive the resultant signal and configured to provide control signaling to the multi-tap settable delay to adjust phase of the second phase signal to provide the output signal with the target duty cycle.

8. The integrated circuit according to claim 7, wherein the control logic is a finite state machine coupled to receive the target duty cycle.

9. The integrated circuit according to claim 8, wherein the first clock source is coupled to the multi-tap settable delay via a first clock network, and wherein the multi-tap settable delay is coupled to the double-data rate flip-flop via a second clock network for propagating the first phase signal and a third clock network for propagating the second phase signal.

10. The integrated circuit according to claim 9, wherein the second sample clock signal is asynchronously swept in phase with respect to the first phase signal in an asynchronous configuration, and wherein the second sample clock signal is synchronously swept in phase with respect to the first phase signal in a synchronous configuration, the second clock source being coupled to receive the first sample clock signal for the synchronous configuration.

11. The integrated circuit according to claim 9, wherein the first clock source is a digital frequency synthesizer, the second clock source is a first delay-locked loop, and the multi-tap settable delay is a second delay-locked loop.

12. The integrated circuit according to claim 9, wherein the first clock network, the second clock network, and the third clock network are programmably configurable for respective propagation of the first sample clock signal, the first phase signal, and the second phase signal, the second clock network and the third clock network configured to provide approximately a same propagation delay for the first phase signal and the second phase signal.

13. The integrated circuit according to claim 12, wherein the first counter, the second counter, the divider, and the finite state machine are configured in programmable logic of a programmable logic device.

14. The integrated circuit according to claim 13, wherein the programmable logic device includes an input/output block.

15. The integrated circuit according to claim 14, wherein the input/output block includes an output buffer and an input buffer, the output buffer coupled to receive the combined signal, the output buffer and the input buffer coupled in series to propagate the combined signal from the output buffer to the input buffer, the input buffer coupled to a counter activation port of the first counter to provide the combined signal thereto.

16. The integrated circuit according to claim 14, wherein the input/output block includes a loopback path, the loopback path coupling the double-data rate flip-flop to a counter activation port of the first counter to provide the combined signal thereto.

17. The integrated circuit according to claim 14, wherein the programmable logic device is a Field Programmable Gate Array.

18. A system for testing duty cycle, comprising:
an integrated circuit, the integrated circuit including:
a first clock source configured to provide a first sample clock signal;
a second clock source configured to provide a second sample clock signal to the first sample clock signal;
a multi-tap settable delay coupled to receive the first sample clock signal and configured to provide a first phase signal and a second phase signal responsive to the first sample clock signal, the first phase signal being out of phase with respect to the second phase signal;
the first clock source and the second clock source configured such that the second sample clock signal is swept in phase with respect to the first phase signal;
a double-data rate flip-flop clocked responsive to the first phase signal and the second phase signal, the double-data rate flip-flop configured to provide a combined signal, the combined signal having rising edges responsive to the first phase signal and having falling edges responsive to the second phase signal, the combined signal having a duty cycle associated with the rising edges and the falling edges;
a first counter and a second counter, the first counter coupled to count responsive to the second sample clock signal and the combined signal to provide a first count, the second counter coupled to count responsive to the second sample clock signal to provide a second count;
a divider coupled to receive the first count and the second count and configured to divide the first count by the second count to provide a resultant signal, the resultant signal being associated with the duty cycle; and
the integrated circuit coupled to a tester, the tester having control logic, the control logic coupled to receive the resultant signal.

19. The system according to claim 18, wherein the tester is coupled and configured to provide control signaling to control the first clock source, the second clock source, and the multi-tap settable delay to adjust the duty cycle of the resultant signal.

20. The system according to claim 19, wherein the tester is coupled to an input/output pad to monitor the duty cycle adjustment of the resultant signal.

* * * * *